United States Patent
So et al.

(10) Patent No.: US 10,342,164 B2
(45) Date of Patent: Jul. 2, 2019

(54) RACK MOUNT-TYPE INFORMATION PROCESSING APPARATUS AND RACK MOUNT-TYPE INFORMATION PROCESSING SYSTEM

(71) Applicant: FUJITSU LIMITED, Kawasaki-shi, Kanagawa (JP)

(72) Inventors: Tsuyoshi So, Kawasaki (JP); Osamu Aizawa, Kasiwa (JP); Keita Hirai, Kawasaki (JP); Koji Nakagawa, Kawasaki (JP); Yoshinori Uzuka, Kawasaki (JP); Nobumitsu Aoki, Kawasaki (JP); Naofumi Kosugi, Yokohama (JP)

(73) Assignee: FUJITSU LIMITED, Kawasaki (JP)

(*) Notice: Subject to any disclaimer, the term of this patent is extended or adjusted under 35 U.S.C. 154(b) by 0 days.

(21) Appl. No.: 15/725,319

(22) Filed: Oct. 5, 2017

(65) Prior Publication Data

US 2018/0132387 A1 May 10, 2018

(30) Foreign Application Priority Data

Nov. 4, 2016 (JP) ................................. 2016-216251

(51) Int. Cl.
*H05K 7/20* (2006.01)

(52) U.S. Cl.
CPC ..... *H05K 7/20772* (2013.01); *H05K 7/20781* (2013.01)

(58) Field of Classification Search
None
See application file for complete search history.

(56) References Cited

U.S. PATENT DOCUMENTS

| 8,305,754 B2* | 11/2012 | Wu | H05K 7/20781 165/104.21 |
| 8,437,129 B2* | 5/2013 | Tung | H05K 7/20781 165/80.4 |
| 8,760,855 B2* | 6/2014 | Howes | H05K 7/20936 174/15.1 |
| 9,025,330 B2* | 5/2015 | Hodes | H05K 7/20754 361/679.47 |
| 2004/0057211 A1* | 3/2004 | Kondo | G06F 1/20 361/696 |
| 2008/0093054 A1* | 4/2008 | Tilton | H05K 7/20681 165/104.21 |

(Continued)

FOREIGN PATENT DOCUMENTS

| JP | 08-032262 | 2/1996 |
| JP | 2013-065227 | 4/2013 |

*Primary Examiner* — Courtney L Smith
(74) *Attorney, Agent, or Firm* — Fujitsu Patent Center

(57) ABSTRACT

A rack mount-type information processing apparatus includes: a plurality of slots, into each of which an electronic device is inserted, a liquid-cooled element provided in a cooling target included in the electronic device, a liquid to cool the cooling target being circulated in the liquid-cooled element; a manifold pipe extending in a direction where the slots are arranged; and a plurality of connection pipes configured to interconnect the liquid-cooled element and the manifold pipe, and coupled in parallel to the manifold pipe at a portion of the manifold pipe which corresponds to at least one slot among the plurality of slots.

14 Claims, 15 Drawing Sheets

(56) References Cited

U.S. PATENT DOCUMENTS

| | | | | |
|---|---|---|---|---|
| 2009/0080151 A1* | 3/2009 | Kalms | ............. | G06F 1/20 |
| | | | | 361/679.52 |
| 2009/0161312 A1* | 6/2009 | Spearing | ............. | H05K 7/20727 |
| | | | | 361/679.47 |
| 2013/0106265 A1* | 5/2013 | Shelnutt | ............. | H05K 7/20254 |
| | | | | 312/236 |
| 2013/0188316 A1* | 7/2013 | Eagle | ............. | G06F 1/20 |
| | | | | 361/702 |
| 2014/0124167 A1* | 5/2014 | Campbell | ............. | H05K 7/20809 |
| | | | | 165/67 |
| 2015/0062804 A1* | 3/2015 | Campbell | ............. | H05K 7/2029 |
| | | | | 361/679.47 |
| 2017/0049009 A1* | 2/2017 | Steinke | ............. | H05K 7/20781 |

* cited by examiner

US 10,342,164 B2

RACK MOUNT-TYPE INFORMATION PROCESSING APPARATUS AND RACK MOUNT-TYPE INFORMATION PROCESSING SYSTEM

CROSS-REFERENCE TO RELATED APPLICATION

This application is based upon and claims the benefit of priority of the prior Japanese Patent Application No. 2016-216251, filed on Nov. 4, 2016, the entire contents of which are incorporated herein by reference.

FIELD

The embodiments discussed herein are related to a rack mount-type information processing apparatus.

BACKGROUND

An electronic device includes various cooling mechanisms.

Related technologies are disclosed in, for example, Japanese Laid-Open Patent Publication No. 08-032262 or Japanese Laid-Open Patent Publication No. 2013-065227.

SUMMARY

A rack mount-type information processing apparatus includes: a plurality of slots, into each of which an electronic device is inserted, a liquid-cooled element provided in a cooling target included in the electronic device, a liquid to cool the cooling target being circulated in the liquid-cooled element; a manifold pipe extending in a direction where the slots are arranged; and a plurality of connection pipes configured to interconnect the liquid-cooled element and the manifold pipe, and coupled in parallel to the manifold pipe at a portion of the manifold pipe which corresponds to at least one slot among the plurality of slots.

The object and advantages of the invention will be realized and attained by means of the elements and combinations particularly pointed out in the claims. It is to be understood that both the foregoing general description and the following detailed description are exemplary and explanatory and are not restrictive of the invention, as claimed.

DESCRIPTION OF EMBODIMENTS

In the field of electronic devices, a liquid cooling-type cooling mechanism, which circulates a liquid coolant, may be adopted instead of an air cooling-type cooling mechanism as the heat generation amount of electronic elements increases. For example, in the case of a rack mount-type information processing apparatus having a plurality of slots, into each of which an electronic device is inserted, such as a rack mount-type server, a coolant pipe is provided in the electronic device to be inserted into the slot. Therefore, the installation space of electronic elements to be mounted in the electronic device is reduced, and as a result the mounting density of the electronic elements deteriorates.

For example, a rack mount-type information processing apparatus, which reduces the deterioration of the mounting density of the electronic elements, may be provided.

Figure 1:
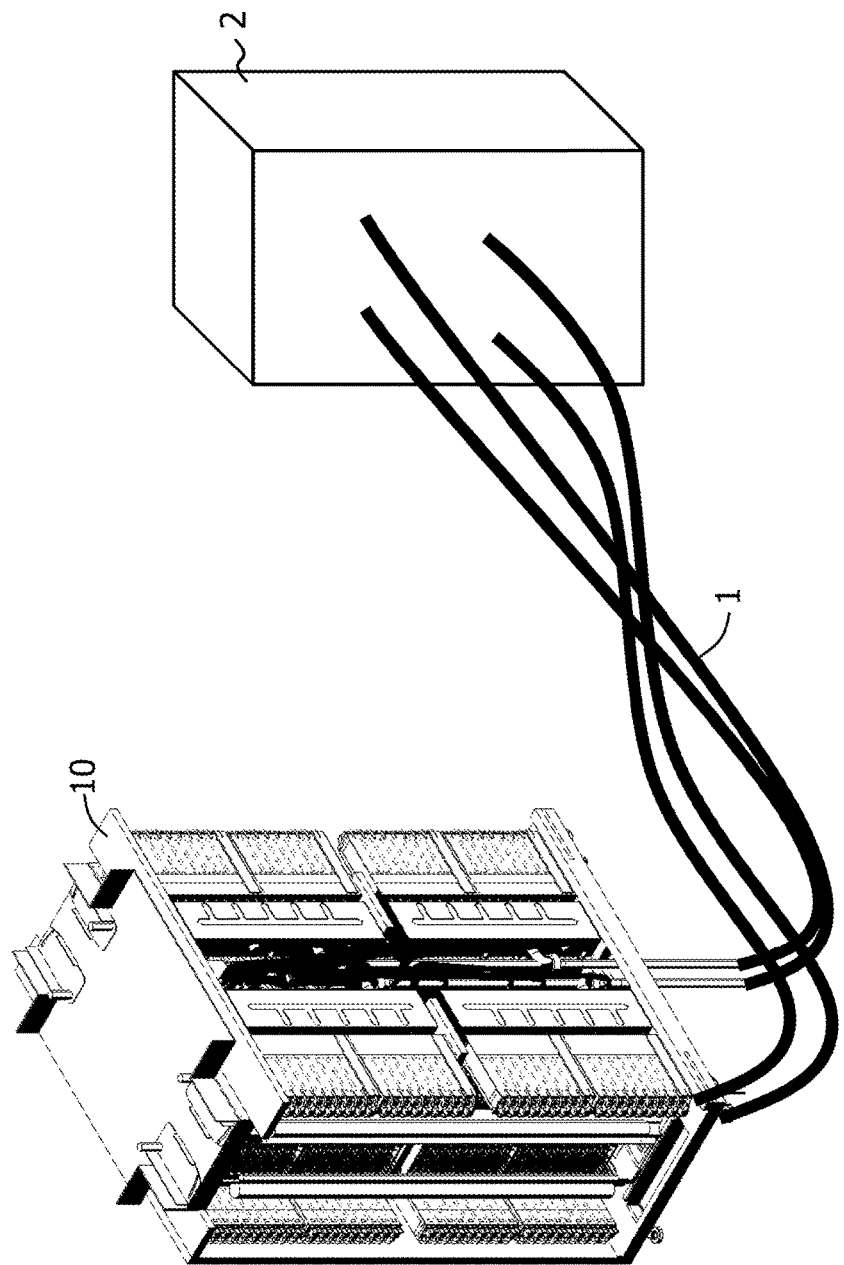
FIG. 1 illustrates an example of an external appearance of a rack mount-type information processing apparatus.

FIG. 1 illustrates an example of an external appearance of a rack mount-type information processing apparatus. The rack mount-type information processing apparatus 10 includes a plurality of slots, into each of which a plate-shaped electronic device is inserted, inside a housing. The rack mount-type information processing apparatus 10 is coupled to a coolant circulation apparatus (hereinafter referred to as "CDU (Coolant Distribution Unit)") 2 via a pipe 1. The rack mount-type information processing apparatus 10 includes therein a manifold pipe that supplies a liquid coolant supplied from the CDU 2 to the electronic device in each slot. FIG. 1 illustrates a rack mount-type information processing apparatus 10, in which respective slots are arranged in the vertical direction. However, the rack mount-type information processing apparatus 10 may be configured such that the respective slots are arranged in the horizontal direction.

Figure 2:
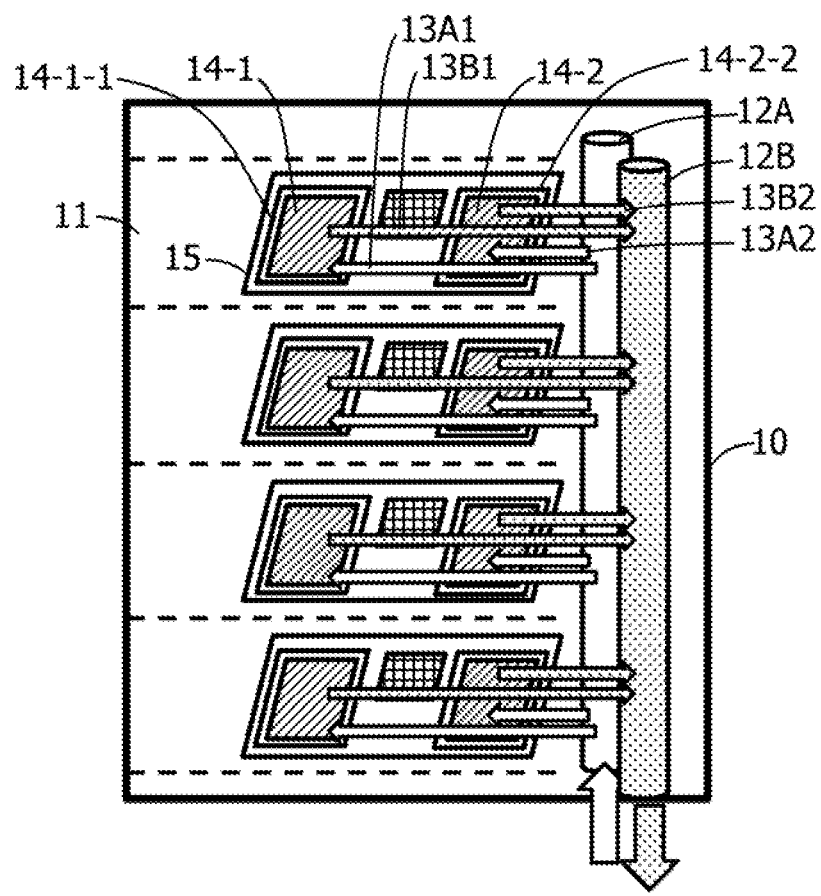
FIG. 2 illustrates an example of an overall structure inside the rack mount-type information processing apparatus.

FIG. 2 illustrates an example of an overall structure inside the rack mount-type information processing apparatus. As illustrated in FIG. 2, the rack mount-type information processing apparatus 10 according to an embodiment includes manifold pipes 12A and 12B extending in the direction in which slots 11, into each of which an electronic device 15 is inserted, are arranged. The manifold pipe 12A may form a portion of the path of the coolant from the CDU 2 to each electronic device 15. Two flexible hoses (e.g., connection pipes 13A1 and 13A2), which interconnect the manifold pipe 12A and the electronic devices 15, are coupled in parallel to a portion of the manifold pipe 12A that corresponds to each slot 11. The manifold pipe 12B may form a portion of the path of the coolant from each electronic device 15 to the CDU 2. Two hoses 13B1 and 13B2, which interconnect the electronic device 15 and the manifold pipe 12B, are coupled in parallel to a portion of the manifold pipe 12B which corresponds to each slot 11. Each electronic device 15 is provided with two liquid-cooled elements 14-1 and 14-2, through which the coolant circulates. The hoses 13A1 and 13B1 are coupled to the liquid-cooled element 14-1, and the hoses 13A2 and 13B2 are coupled to the liquid-cooled element 14-2. Both the liquid-cooled elements 14-1 and 14-2 are provided in cooling target units 14-1-1 and 14-2-2, respectively, for example, various heat generating elements of, for example, a calculation processing apparatus.

Figure 3:
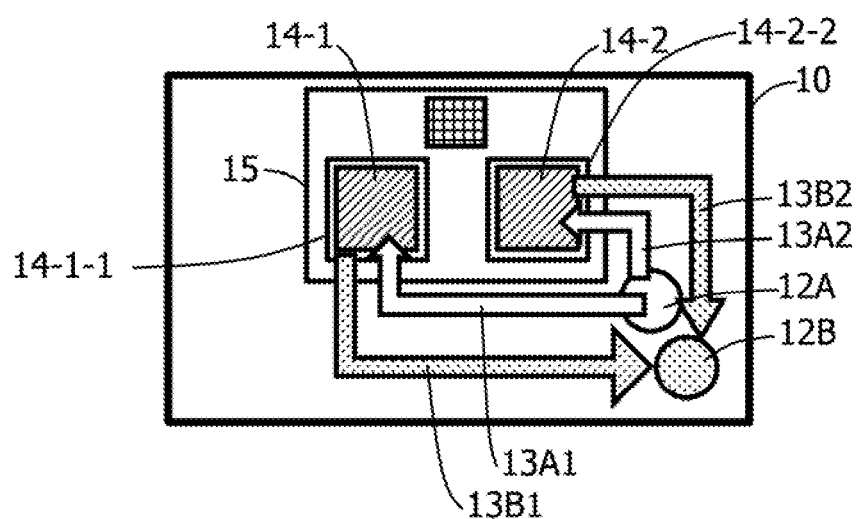
FIG. 3 illustrates an example of a connection state between an electronic device and manifold pipes in the rack mount-type information processing apparatus.

FIG. 3 illustrates an example of a connection state between the electronic device and the manifold pipes in the rack mount-type information processing apparatus. In FIG. 3, the rack mount-type information processing apparatus of FIGS. 1 and 2 is illustrated. In the rack mount-type information processing apparatus 10, the liquid-cooled element 14-1 is coupled to the manifold pipes 12A and 12B via the hoses 13A1 and 13B1, and the liquid-cooled element 14-2 is coupled the manifold pipes 12A and 12B via the hoses 13A2 and 13B2. For example, the electronic device 15 is not provided with a coolant pipe that directly couples the liquid-cooled element 14-1 and the liquid-cooled element 14-2 to each other. Since this rack mount-type information processing apparatus 10 is not provided with a coolant pipe that directly couples the liquid-cooled element 14-1 and the liquid-cooled element 14-2 to each other, the deterioration of the mounting density of the electronic elements, which may be caused due to the reduction in the installation space of the electronic elements mounted in the electronic device 15, may be reduced. Each of the liquid-cooled elements 14-1 and 14-2 directly receives the coolant supplied from the manifold pipe 12A. Therefore, there is no difference in the temperature of the coolant between the liquid-cooled elements 14-1 and 14-2, and the respective liquid-cooled elements 14-1 and 14-2 may be properly cooled.

Figure 4:
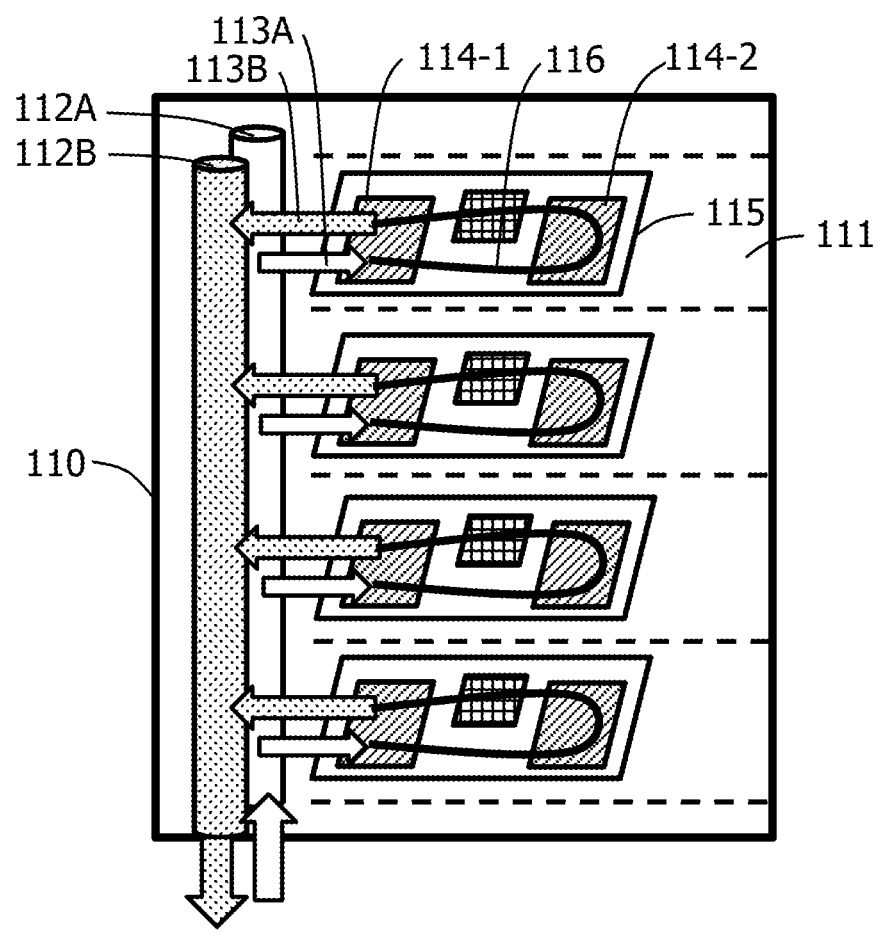
FIG. 4 illustrates an example of an overall structure inside a rack mount-type information processing apparatus.

FIG. 4 illustrates an example of an overall structure inside a rack mount-type information processing apparatus. The rack mount-type information processing apparatus 110 illustrated in FIG. 4 includes manifold pipes 112A and 112B, which extend along slots 111, into each of which an electronic device 115 is inserted. A single flexible hose 113A, which interconnects the manifold pipe 112A and the electronic device 115, is coupled to a portion of the manifold pipe 112A which corresponds to each slot 111. A single flexible hose 113B, which interconnects the manifold pipe 112B and the electronic device 115, is coupled to a portion of the manifold pipe 112B which corresponds to each slot 111. The hoses 113A and 113B are coupled to a liquid-cooled element 114-1. A liquid-cooled element 114-2 is not coupled to the manifold pipes 112A and 112B, but is coupled to the liquid-cooled element 114-1 via an in-device pipe 116, which is provided in the electronic device 115.

Figure 5:
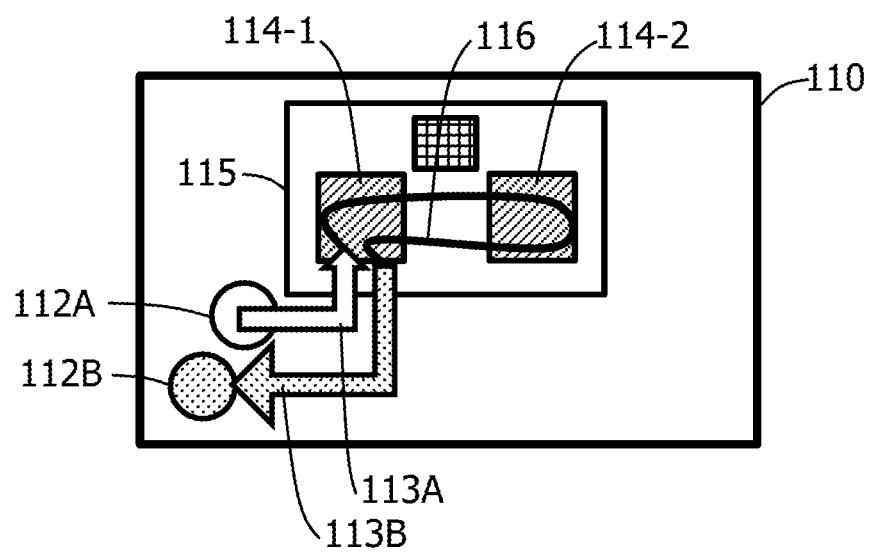
FIG. 5 illustrates an example of a connection state between an electronic device and manifold pipes in the rack mount-type information processing apparatus.

FIG. 5 illustrates an example of a connection state between the electronic device and the manifold pipes in the rack mount-type information processing apparatus. In FIG. 5, the rack mount-type information processing apparatus of FIG. 4 is illustrated. In the rack mount-type information processing apparatus 110, the in-device pipe 116, which interconnects the liquid-cooled element 114-1 and the liquid-cooled element 114-2, is disposed in the electronic device 115. Therefore, in the rack mount-type information processing apparatus 110 illustrated in FIG. 5, the installation space of electronic elements mounted in the electronic device 115 may be reduced due to the arrangement of the in-device pipe 116, which may cause decrease in the mounting density of the electronic elements. Since the liquid-cooled element 114-1 and the liquid-cooled element 114-2 are coupled in series on the path of the in-device pipe 116, the temperature of the coolant may rise from the upstream side to the downstream side, and the cooling performance may not be sufficiently exerted.

Figure 6:
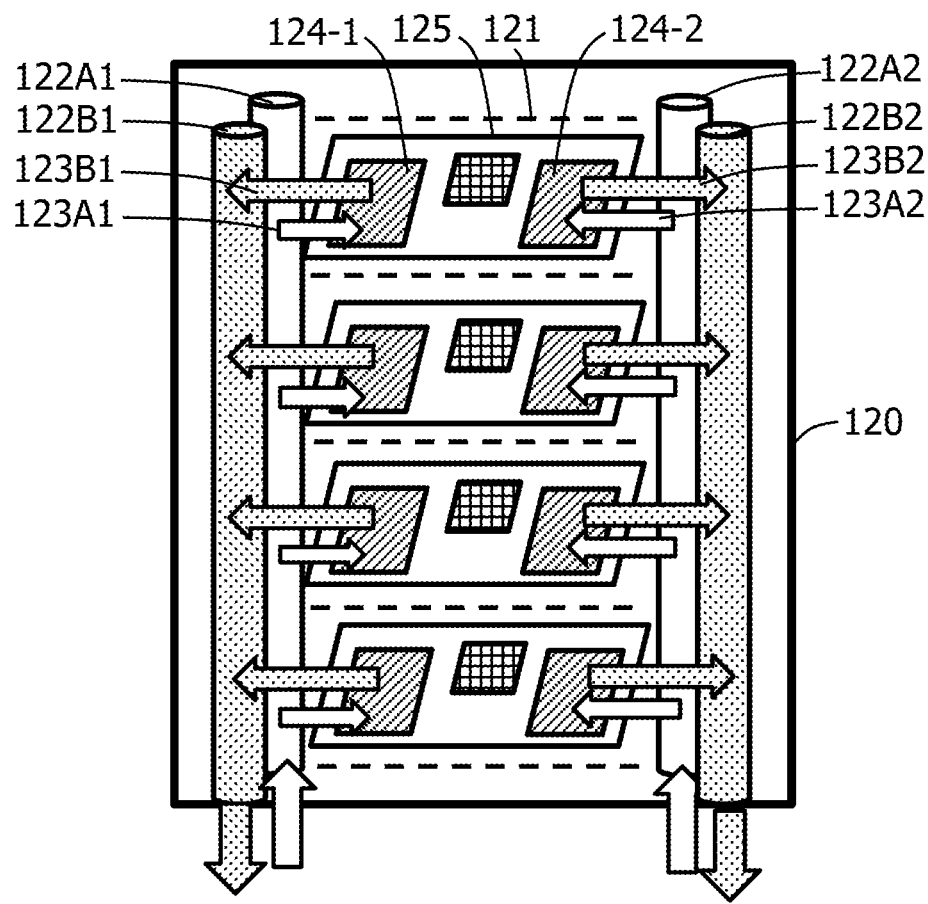
FIG. 6 illustrates an example of an overall structure inside a rack mount-type information processing apparatus.

FIG. 6 illustrates an example of an overall structure inside a rack mount-type information processing apparatus. The rack mount-type information processing apparatus 120 illustrated in FIG. 6 includes manifold pipes 122A1, 122B1, 122A2, and 122B, which extend along slots 121 into each of which an electronic device 125 is inserted. A single flexible hose 123A1, which interconnects the manifold pipe 122A1 and the electronic device 125, is coupled to a portion of the manifold pipe 122A1 which corresponds to each slot 121. A single flexible hose 123B1, which interconnects the manifold pipe 122B1 and the electronic device 125, is coupled to a portion of the manifold pipe 122B1 which corresponds to each slot 121. A single flexible hose 123A2, which interconnects the manifold pipe 122A2 and the electronic device 125, is coupled to a portion of the manifold pipe 122A2 which corresponds to each slot 121. A single flexible hose 123B2, which interconnects the manifold pipe 122B2 and the electronic device 125, is coupled to a portion of the manifold pipe 122B2 that corresponds to each slot 121. The hoses 123A1 and 123B1 are coupled to a liquid-cooled element 124-1, and the hoses 123A2 and 123B2 are coupled to a liquid-cooled element 124-2.

Figure 7:
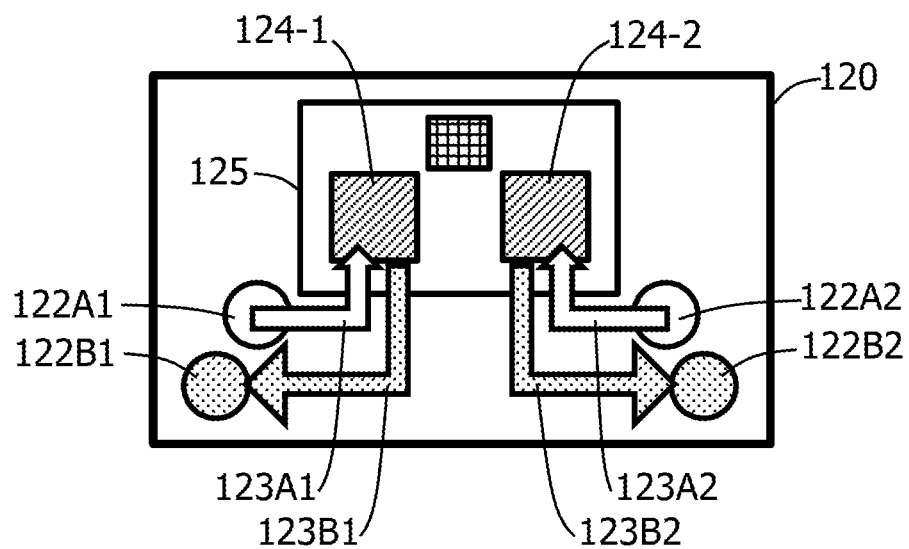
FIG. 7 illustrates an example of a connection state between an electronic device and manifold pipes in the rack mount-type information processing apparatus.

FIG. 7 illustrates an example of a connection state between the electronic device and the manifold pipes in the rack mount-type information processing apparatus. In FIG. 7, the rack mount-type information processing apparatus of FIG. 6 is illustrated. In addition to the manifold pipes 122A1 and 122B1 coupled to the liquid-cooled element 124-1, the manifold pipes 122A2 and 122B2 coupled to the liquid-cooled element 124-2 are disposed inside the rack mount-type information processing apparatus 120. Compared to, for example, the rack mount-type information processing apparatus 10 illustrated in FIG. 3, a large space is used for the installation of the manifold pipes 122A1, 122B1, 122A2 and 122B2. Therefore, when viewing the entire rack mount-type information processing apparatus 120 in an overhead view, the mounting density of the electronic elements may decrease.

Figure 8:
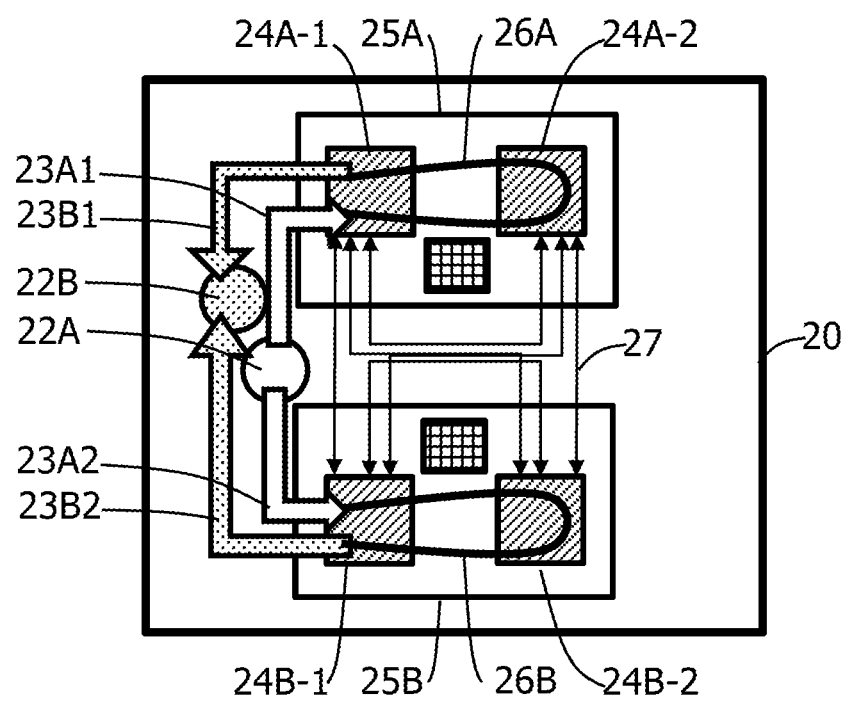
FIG. 8 illustrates an example of a connection state between an electronic device and manifold pipes in the rack mount-type information processing apparatus.

FIG. 8 illustrates an example of a connection state between the electronic device and the manifold pipes in the rack mount-type information processing apparatus. In FIG. 8, the rack mount-type information processing apparatus of FIGS. 1 and 2 is illustrated. The rack mount-type information processing apparatus 20 illustrated in FIG. 8 includes two rows of slots, into each of which an electronic device is inserted, an electronic device 25A is inserted into a slot in any one row among the two rows of slots, and an electronic device 25B is inserted into a slot in the other row. Liquid-cooled elements 24A-1 and 24A-2 are provided in the electronic device 25A, and liquid-cooled elements 24B-1 and 24B-2 are provided in the electronic device 25B. The rack mount-type information processing apparatus 20 is provided with manifold pipes 22A and 22B, which are coupled to the electronic devices 25A and 25B. Two hoses including a hose 23A1, which interconnects the liquid-cooled element 24A-1 of the electronic device 25A and the manifold pipe 22A, and a hose 23A2, which interconnects the liquid-cooled element 24B-1 of the electronic device 25B and the manifold pipe 22A, are coupled in parallel to a portion of the manifold pipe 22A which corresponds to each slot. Two hoses including a hose 23B1, which interconnects the liquid-cooled element 24A-1 of the electronic device 25A and the manifold pipe 22B, and a hose 23B2, which interconnects the liquid-cooled element 24B-1 of the electronic device 25B and the manifold pipe 22B, are coupled in parallel to a portion of the manifold pipe 22B which corresponds to each slot. The liquid-cooled element 24A-2 is not coupled to the manifold pipes 22A and 22B, but is coupled to the liquid-cooled element 24A-1 via an in-device pipe 26A, which is provided in the electronic device 25A. The liquid-cooled element 24B-2 is not coupled to the manifold pipes 22A and 22B, but is coupled to the liquid-cooled element 24B-1 via an in-device pipe 26B, which is disposed in the electronic device 25B.

In the rack mount-type information processing apparatus 20, both the electronic device 25A and the electronic device 25B share the manifold pipes 22A and 22B. Therefore, in the rack mount-type information processing apparatus 20 illustrated in FIG. 8, compared to a case where a manifold pipe, which supplies the coolant to the electronic device 25A, and a manifold pipe, which supplies the coolant to the electronic device 25B, are separately provided, the installation space of the manifold pipes may be reduced, and the overall mounting density of the electronic elements may be improved.

Figure 9:
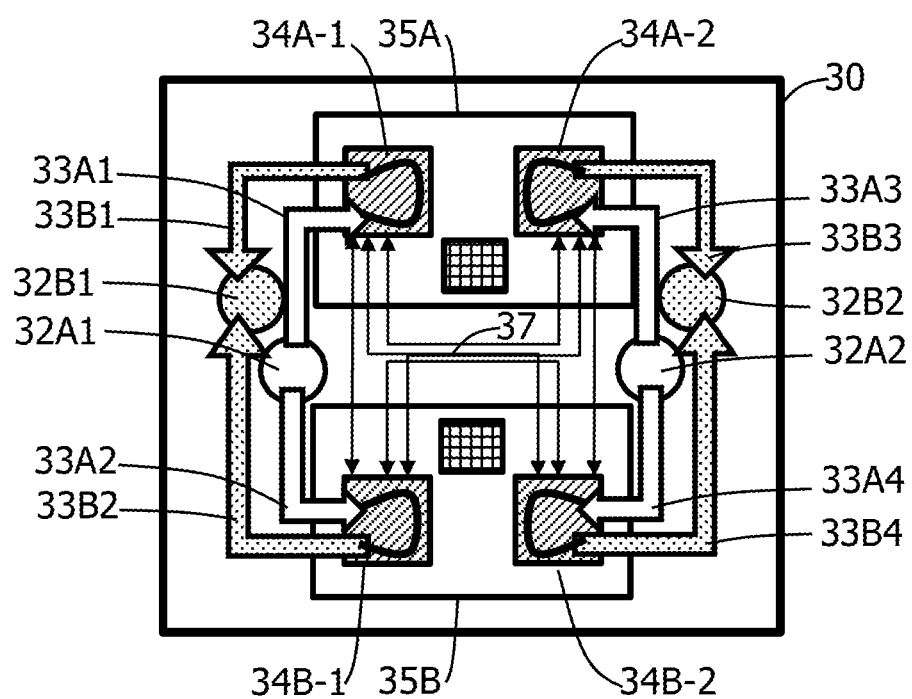
FIG. 9 illustrates an example of a connection state between an electronic device and manifold pipes in the rack mount-type information processing apparatus.

FIG. 9 illustrates an example of a connection state between the electronic device and the manifold pipes in the rack mount-type information processing apparatus. In FIG. 9, the rack mount-type information processing apparatus of FIGS. 1 and 2 is illustrated. The rack mount-type information processing apparatus 30 illustrated in FIG. 9 is configured such that two manifold pipes are added to the rack mount-type information processing apparatus 20 illustrated in FIG. 8. Instead, the in-device pipe, which interconnects the liquid-cooled elements, is omitted. The rack mount-type information processing apparatus 30 illustrated in FIG. 9 includes an electronic device 35A, which is provided with liquid-cooled elements 34A-1 and 34A-2, and an electronic device 35B, which is provided with liquid-cooled elements 34B-1 and 34B-2. The rack mount-type information processing apparatus 30 is provided with manifold pipes 32A1, 32B1, 32A2 and 32B2, which are coupled to the electronic devices 35A and 35B. Two hoses including a hose 33A1, which interconnects the liquid-cooled element 34A-1 of the electronic device 35A and the manifold pipe 32A1, and a hose 33A2, which interconnects the liquid-cooled element 34B-1 of the electronic device 35B and the manifold pipe 32A1, are coupled in parallel to the portion of a manifold pipe 32A1 which corresponds to each slot. Two hoses including a hose 33B1, which interconnects the liquid-cooled element 34A-1 of the electronic device 35A and the manifold pipe 32B1, and a hose 33B2, which interconnects the liquid-cooled element 34B-1 of the electronic device 35B and the manifold pipe 32B1, are coupled in parallel to a portion of the manifold pipe 32B1 that corresponds to each slot. Two hoses including a hose 33A3, which interconnects the liquid-cooled element 34A-2 of the electronic device 35A and the manifold pipe 32A2, and a hose 33A4, which interconnects the liquid-cooled element 34B-2 of the electronic device 35B and the manifold pipe 32A2, are coupled in parallel to a portion of the manifold pipe 32A2 which corresponds to each slot. Two hoses including a hose 33B3, which interconnects the liquid-cooled element 34A-2 of the electronic device 35A and the manifold pipe 32B2, and a hose 33B4, which interconnects the liquid-cooled element 34B-2 of the electronic device 35B and the manifold pipe 32B2, are coupled in parallel to a portion of the manifold pipe 32B2 which corresponds to each slot.

In the rack mount-type information processing apparatus 30 illustrated in FIG. 9, the mounting density of the electronic elements of the respective electronic devices 35A and 35B may be improved by the reduction in the installation space of the pipes inside the housing.

Figure 10:
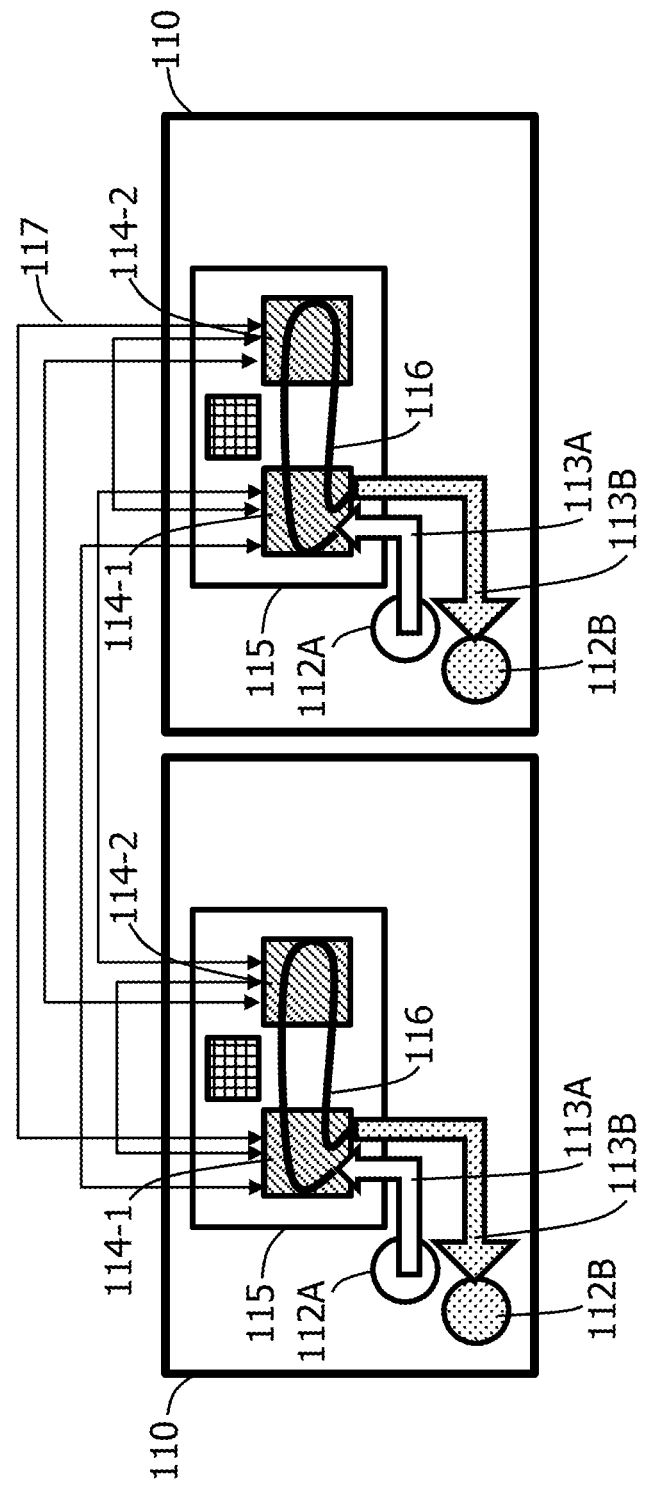
FIG. 10 illustrates an example of a state where electronic devices, which are respectively provided in separate rack mount-type information processing apparatuses, are coupled to each other via a data transmission cable.
Figure 11:
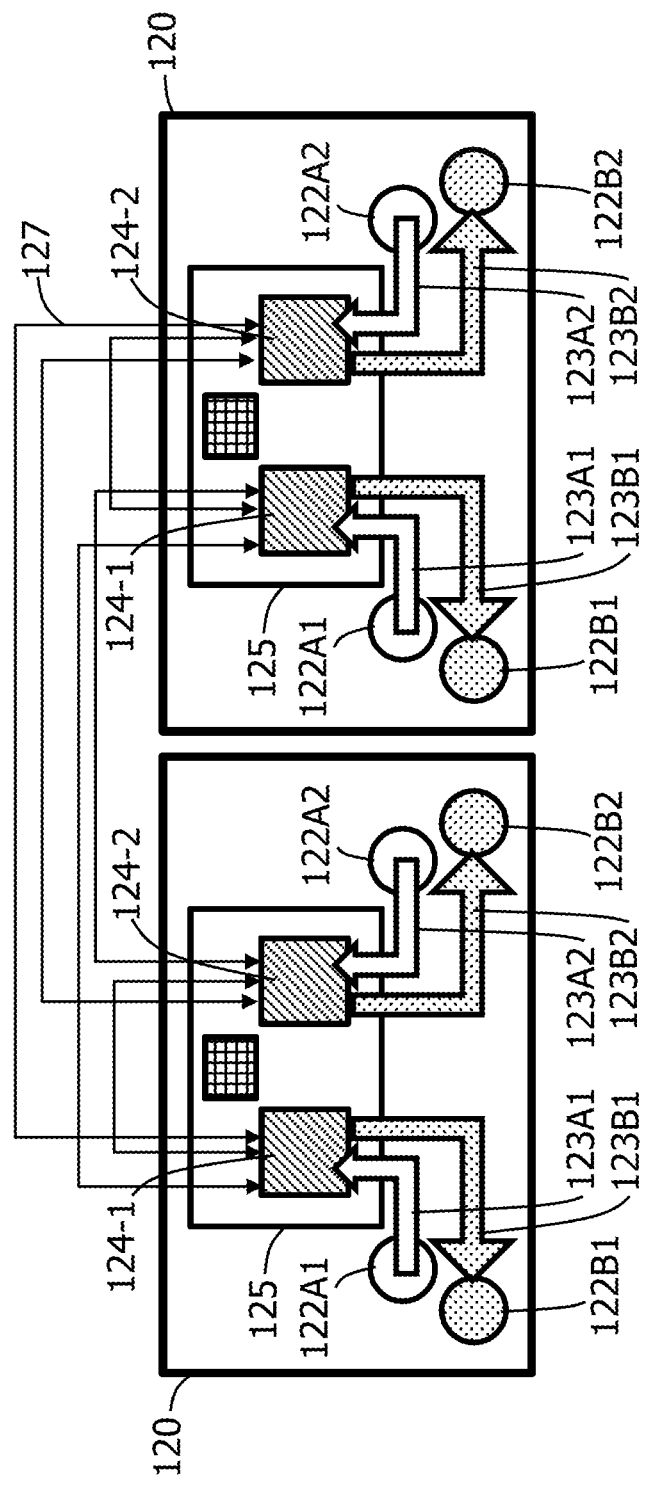
FIG. 11 illustrates an example of a state where electronic devices, which are respectively provided in separate rack mount-type information processing apparatuses, are connected to each other via a data transmission cable.
Figure 12:
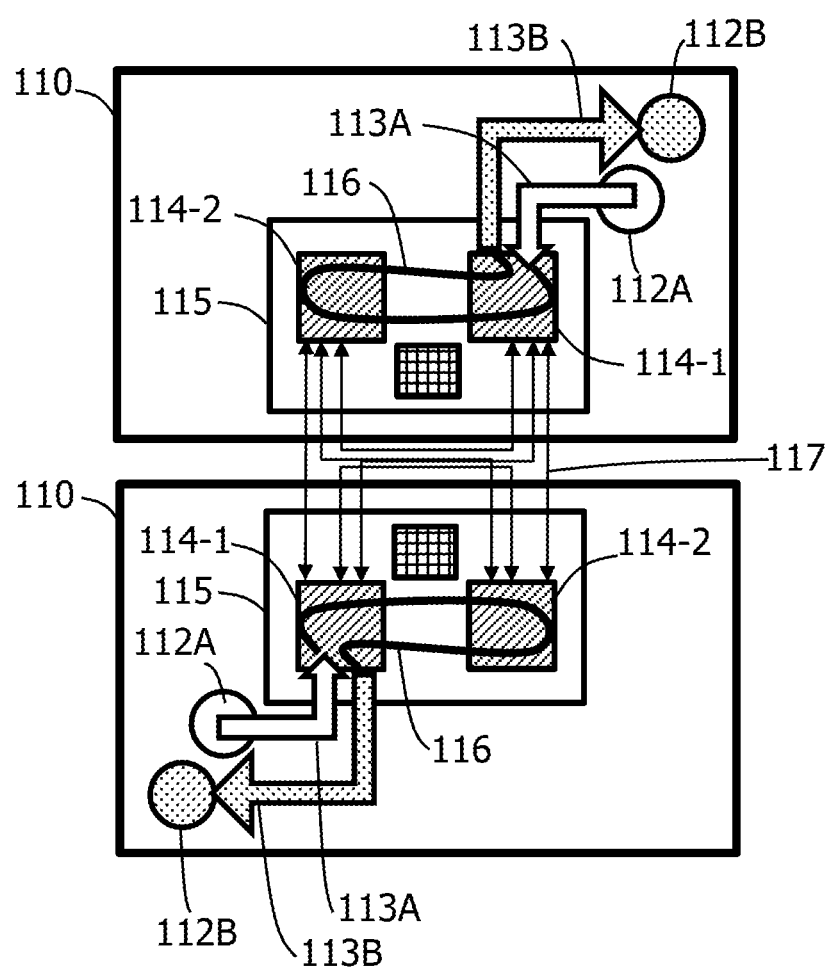
FIG. 12 illustrates an example of a state where electronic devices, which are respectively provided in separate rack mount-type information processing apparatuses, are coupled to each other via a data transmission cable.
Figure 13:
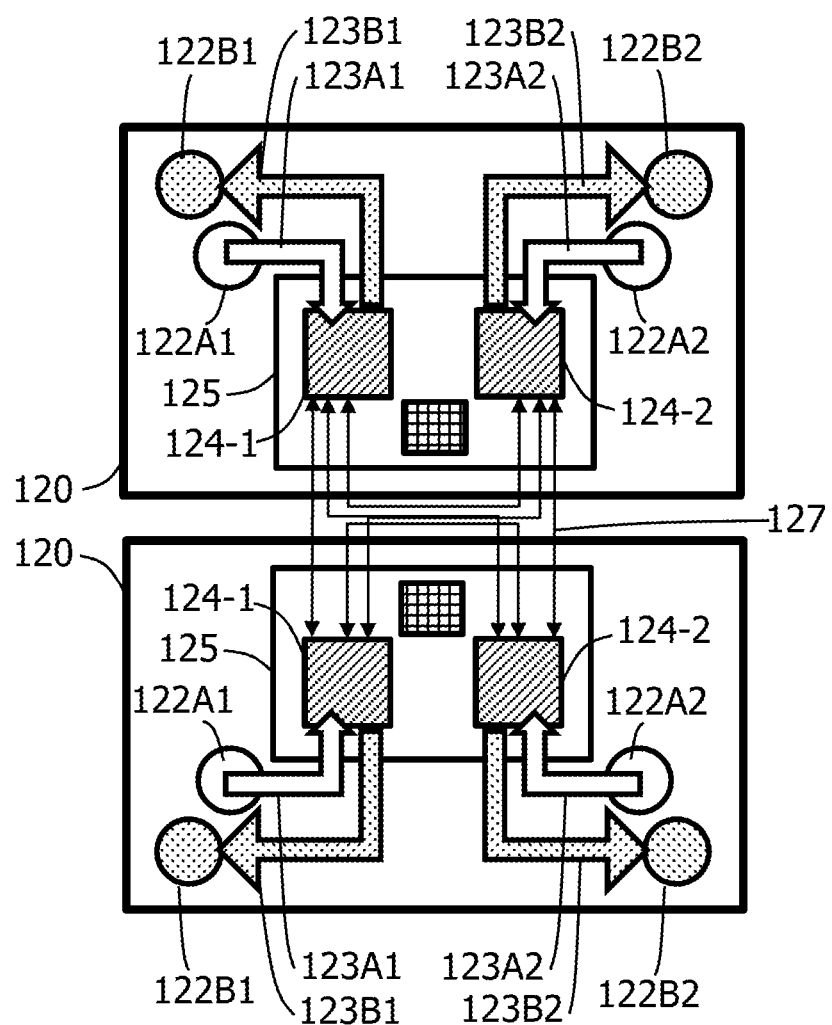
FIG. 13 illustrates an example of a state where electronic devices, which are respectively provided in separate rack mount-type information processing apparatuses, are coupled to each other via a data transmission cable.

Both the electronic device 25A and the electronic device 25B are provided in the same rack mount-type information processing apparatus 20. Therefore, compared to a case where the electronic device 25A and the electronic device 25B are provided in separate rack-mount-type information processing apparatuses with each other, the length of a data transmission cable 27, which interconnects the electronic devices to each other, may be shortened. Each of FIGS. 10, 11, 12, and 13 illustrates an example of a state where electronic devices, which are respectively provided in separate rack mount-type information processing apparatuses, are coupled to each other by a data transmission cable. FIG. 10 illustrates a first state where electronic devices 115, which are respectively provided in two separate rack mount-type information processing apparatuses 110, are coupled to each other by a data transmission cable 117. FIG. 11 illustrates a second state where electronic devices 125, which are respectively provided in two separate rack-mount-type information processing apparatuses 120, are coupled to each other by a data transmission cable 127. FIG. 12 illustrates a third state where the electronic devices 115, which are respectively provided in the two separate rack mount-type information processing apparatuses 110, are coupled to each other by the data transmission cable 117. FIG. 13 illustrates a fourth state where the electronic devices 125, which are respectively provided in the two separate rack mount-type information processing apparatuses 120, are coupled to each other by the data transmission cable 127. For example, in a case where the electronic devices 35A and 35B, which are provided in one rack-mount-type information processing apparatus 30, are coupled to each other by a data transmission cable 37, compared to cases where the electronic devices 115 or 125, which are respectively provided in the two separate rack mount-type information processing apparatuses 110 or 120, are coupled to each other by the data transmission cable 117 or 127, the cable may be shortened as much as the cable is pulled around to the outer portion of the rack mount-type information processing apparatus 110 or 120. When the cable is shortened, the speed of communication between the electronic devices 35A and 35B may be improved.

Figure 14:
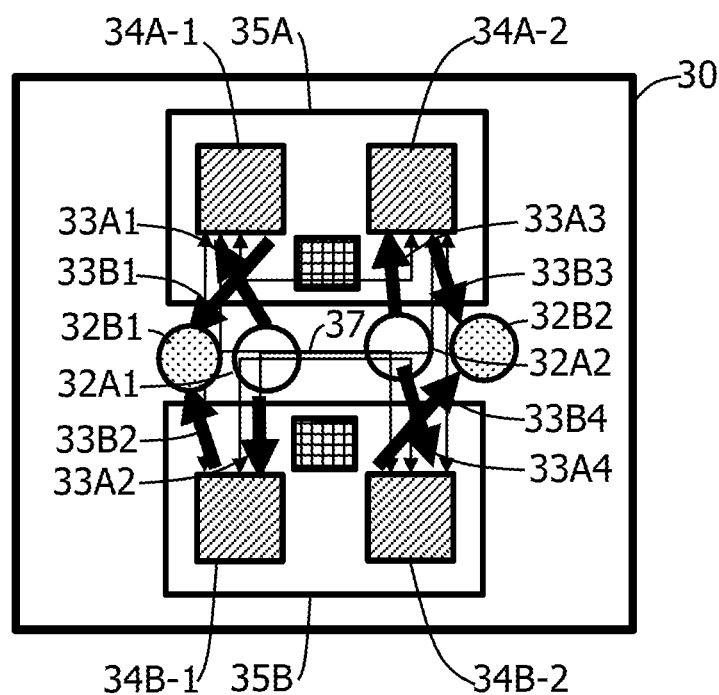
FIG. 14 illustrates an example of manifold pipes disposed between slots.
Figure 15:
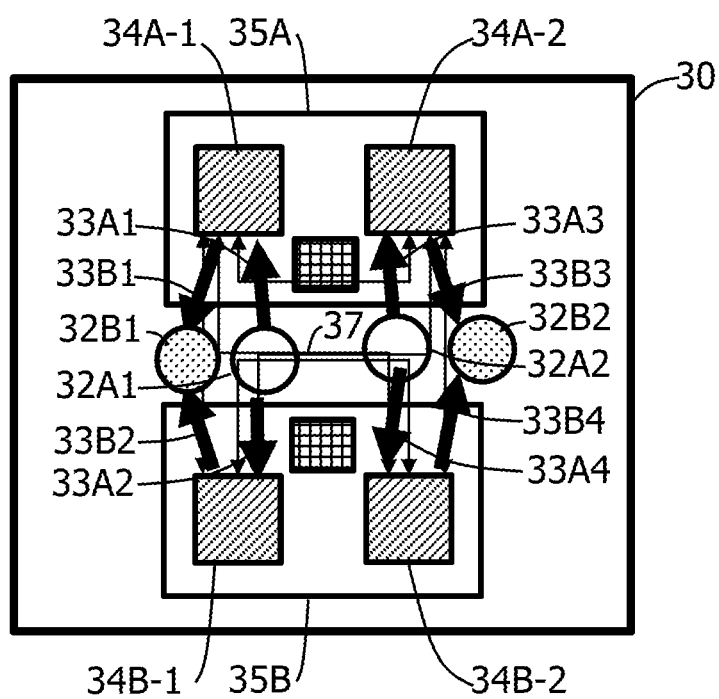
FIG. 15 illustrates an example of manifold pipes disposed between slots.

In FIG. 9, although the manifold pipes 32A1, 32B1, 32A2, and 32B2 are disposed outside a gap between the electronic devices 35A and 35B, the manifold pipes 32A1, 32B1, 32A2, and 32B2 may be disposed between the electronic device 35A and the electronic device 35B. FIGS. 14 and 15 illustrate an example of manifold pipes disposed between slots. In FIG. 14, the manifold pipes 32A1, 32B1, 32A2, and 32B2 are disposed between the electronic device 35A and the electronic device 35B. In FIG. 15, the manifold pipes 32A1, 32B1, 32A2, and 32B2 are disposed between the electronic device 35A and the electronic device 35B. When the manifold pipes 32A1, 32B1, 32A2, and 32B2 are disposed between the electronic device 35A and the electronic device 35B, the hoses 33A1, 33A2, 33A3, 33A4, 33B1, 33B2, 33B3, and 33B4 may be shortened. For example, as illustrated in FIG. 15, a positional relationship between the inlet and the outlet of hose connection ports in a liquid-cooled element is changed, for example, when a liquid-cooled element is mounted inside out. Therefore, as illustrated in FIG. 15, further shortening may be attained when the hoses 33A1, 33A2, 33A3, 33A4, 33B1, 33B2, 33B3, and 33B4 do not cross each other. For example, when the manifold pipes 32A1, 32B1, 32A2, and 32B2 are located close to the liquid-cooled element, a connection coupler, for example, a connection pipe may be used instead of the hoses 33A1, 33A2, 33A3, 33A4, 33B1, 33B2, 33B3, and 33B4. When the coupler is used instead of the hoses, insertion and removal of the electronic device into and from the slot may be easily implemented.

The above embodiments may be appropriately combined with each other. For example, one rack mount-type information processing apparatus may be provided with a plurality of slots in three or more rows, into which electronic devices are inserted. For example, in the rack mount-type information processing apparatus, the electronic devices may not be inserted in all of the slots. For example, a plurality of hoses, which are coupled in parallel to the manifold pipe at a portion of the manifold pipe which corresponds to at least one of the slots, may be coupled to an electronic device in the slot which corresponds to the coupled portion of the manifold pipe, or may be coupled to an electronic device in a slot which corresponds to another portion of the manifold pipe. The plurality of hoses, which is coupled in parallel to the manifold pipe at a portion of the manifold pipe which corresponds to at least one of the slots, may be coupled, for example, to electronic devices of the slots at different stages.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to an illustrating of the superiority and inferiority of the invention. Although the embodiments of the present invention have been described in detail, it should be understood that the various changes, substitutions, and alterations could be made hereto without departing from the spirit and scope of the invention.

What is claimed is:

1. A rack mount-type information processing apparatus comprising:
    a plurality of slots, into which a plurality of electronic devices is inserted, respectively;
    a liquid-cooled element provided in a cooling target included in each of the plurality of electronic devices, a liquid coolant to cool the cooling target being circulated in the liquid-cooled element;
    a manifold pipe extending in a direction where the slots are arranged; and
    a plurality of connection pipes configured to interconnect the liquid-cooled element and the manifold pipe, and coupled in parallel to the manifold pipe at a portion of the manifold pipe which corresponds to at least one slot among the plurality of slots,
    the liquid-cooled element is connected to a first connection pipe that supplies the liquid coolant to the liquid-cooled element, and a second connection pipe that discharges the liquid coolant from the liquid-cooled element, among the plurality of connection pipes.

2. The apparatus according to claim 1, wherein the liquid-cooled element are provided as a plurality of liquid-cooled elements in the cooling target, and
    the plurality of connection pipes are connected to the liquid-cooled elements, respectively.

3. The apparatus according to claim 1, wherein the liquid-cooled element are provided as a plurality of liquid-cooled elements in the cooling target, and
    each of the plurality of liquid-cooled elements is connected to a first connection pipe that supplies the liquid coolant to the liquid-cooled element, and a second connection pipe that discharges the liquid coolant from the liquid-cooled element, among the plurality of connection pipes.

4. The apparatus according to claim 1, wherein the plurality of slots are provided in a plurality of rows, and
    the plurality of connection pipes are coupled to a first electronic device in a first slot of one row of the plurality of rows and a second electronic device in a second slot of another row of the plurality of rows.

5. The apparatus according to claim 4, wherein the manifold pipe is disposed between one of the plurality of rows and another of the plurality of rows.

6. A rack mount-type information processing system comprising:
    a rack mount-type information processing apparatus having a plurality of slots, into which a plurality of electronic devices is inserted, respectively;
    a coolant circulation device configured to supply a liquid coolant to the rack mount-type information processing apparatus; and
    a pipe configured to interconnect the rack mount-type information processing apparatus and the coolant circulation device,
    the rack mount-type information processing apparatus includes:
    a liquid-cooled element provided in a cooling target included in each of the plurality of electronic devices, the liquid coolant to cool the cooling target being circulated in the liquid-cooled element;
    a manifold pipe extending in a direction where the slots are arranged; and
    a plurality of connection pipes configured to interconnect the liquid-cooled element and the manifold pipe, and coupled in parallel to the manifold pipe at a portion of the manifold pipe which corresponds to at least one slot among the plurality of slots,
    the liquid-cooled element is connected to a first connection pipe that supplies the liquid coolant to the liquid-cooled element, and a second connection pipe that discharges the liquid coolant from the liquid-cooled element, among the plurality of connection pipes.

7. The system according to claim 6, wherein the liquid-cooled element are provided as a plurality of liquid-cooled elements in the cooling target, and
    the plurality of connection pipes are connected to the liquid-cooled elements, respectively.

8. The system according to claim 6, wherein the liquid-cooled element are provided as a plurality of liquid-cooled elements in the cooling target, and
    each of the plurality of liquid-cooled elements is connected to a first connection pipe that supplies the liquid coolant to the liquid-cooled element, and a second connection pipe that discharges the liquid coolant from the liquid-cooled element, among the plurality of connection pipes.

9. The system according to claim 6, wherein the plurality of slots are provided in a plurality of rows, and the plurality of connection pipes are coupled to a first electronic device in a first slot of one row of the plurality of rows and a second electronic device in a second slot of another row of the plurality of rows.

10. The system according to claim 9, wherein the manifold pipe is disposed between one of the plurality of rows and another of the plurality of rows.

11. The apparatus according to claim 4, wherein the first electronic device of the first slot and the second electronic device of the second slot share the manifold pipe.

12. The system according to claim 9, wherein the first electronic device of the first slot and the second electronic device of the second slot share the manifold pipe.

13. The apparatus according to claim 1, wherein the plurality of connection pipes are configured to directly interconnect the liquid-cooled element and the manifold pipe.

14. The system according to claim 6, wherein the plurality of connection pipes are configured to directly interconnect the liquid-cooled element and the manifold pipe.

* * * * *